United States Patent

[11] 3,601,666

[72] Inventors Hayden M. Leedy
Plano;
Neal J. Tolar, Richardson, both of, Tex.
[21] Appl. No. 851,781
[22] Filed Aug. 21, 1969
[45] Patented Aug. 24, 1971
[73] Assignee Texas Instruments Incorporated
Dallas, Tex.

[54] TITANIUM TUNGSTEN-GOLD CONTACTS FOR SEMICONDUCTOR DEVICES
6 Claims, 2 Drawing Figs.

[52] U.S. Cl. ........................................................ 317/234 R, 317/234 L, 317/234 M, 317/234 N
[51] Int. Cl. ........................................................ H01l 19/00
[50] Field of Search ............................................ 317/234, 235, 234 L, 234 M, 234 N, 235 N, 234 R

[56] References Cited
UNITED STATES PATENTS

| | | | |
|---|---|---|---|
| 3,290,570 | 12/1966 | Cunningham et al. ........ | 317/240 |
| 3,499,213 | 3/1970 | Lands et al. .................. | 29/577 |
| 3,416,042 | 12/1968 | Thomas et al. ............... | 317/234 |

*Primary Examiner*—John W. Huckert
*Assistant Examiner*—Martin H. Edlow
*Attorneys*—James O. Dixon, Andrew M.Hassell, Harold Levine, Henry T. Olsen, Michael A. Sileo, Jr. and Gary C. Honeycutt

ABSTRACT: A trimetal ohmic contact system comprising titanium covered by tungsten and then gold is provided for semiconductors, especially forsilicon devices. For best results it is essential to deposit the titanium by evaporation, since it is very difficult to obtain good ohmic contactwith a sputtered film.

INVENTOR
Hayden M. Leedy
Neal J. Tolar

TITANIUM TUNGSTEN-GOLD CONTACTS FOR SEMICONDUCTOR DEVICES

This invention relates to thin film metallization systems for semiconductor devices, and more particularly to ohmic contacts for diodes, transistors and integrated circuits, and to methods for making such contacts.

Ohmic contacts to semiconductor devices must be composed of materials which have good chemical, electrical, thermal, and mechanical properties, both in the ultimate environment to which the devices are subjected, and during the various stages of fabrication. The selection of ohmic contact materials is especially difficult for silicon devices, including both the planar and nonplanar types.

In the fabrication of planar silicon devices, a silicon oxide layer typically overlies the silicon surface except in the ohmic contact areas, the silicon oxide functioning to passivate the junctions and to provide an insulating base for expanded metal contacts and interconnections. Particularly in integrated circuits, strips of conductive metal extend from one semiconductor region over the oxide coating, across various regions and junctions of the device, to contact one or more other active or passive regions. Accordingly, the contact material must exhibit good adherence to silicon and to silicon oxide or other insulating layers, and yet must not produce any undesirable reaction with, nor penetrate the underlying silicon oxide or silicon surfaces.

Modern techniques for the fabrication of semiconductor devices and integrated circuits rely heavily upon photolithographic techniques to form diffusion masks, define contact areas, etc. Accordingly, the selection of compatible contact metals is limited in this regard to metals which can be reliably deposited as extremely thin films, and to metals which are readily amenable to photolithographic processing techniques.

There is a continuing trend in semiconductor technology toward devices operable at higher frequencies and capable of switching at higher speeds. Of necessity, the physical dimensions of such devices must be very small to provide these characteristics. For example, the emitter region of a high-frequency transistor may occupy 0.1 mil$^2$ or less on the face of a semiconductor wafer, and may have a depth of only a few hundredths of one mil. Connection cannot be made directly to such a region with a bonded wire, so the contact area must be expanded out over the oxide to make room for the attachment of an external lead. In transistors of this type the oxide layer over the base region is very thin because of the short time during which the device can be held at temperatures which promote oxide growth. Typically, such a layer would be less than 2000 angstroms thick compared to almost 10,000 angstroms over the collector. Therefore, degradation due to penetration of the contact metal through the oxide would be particularly severe in high frequency devices. Similarly, any penetration of the metal into the emitter region would punch through the emitter junction because of its extreme shallowness.

The contact metal must not form an alloy with the semiconductor material at temperatures used in the bonding of leads to the device, or in subsequent packaging steps. Formation of such an alloy would also result in the penetration of the metal into shallow semiconductor regions, causing failure of the device. This limitation prevents the use of gold in direct contact with silicon because of its low eutectic temperature. In like manner, the contact metal must not have a melting point below that temperature to which the device is exposed in subsequent processing or operation.

An additional requirement for a contact metal is that it provide an ohmic, low-resistance contact to the semiconductor surface. If the device is made of silicon, particular problems occur because of the inherent chemical properties of the material, including particularly the tendency of the silicon to form an oxide. Moreover, if the contact metal is a donor or acceptor impurity for the semiconductor, it must have a low solubility so that the tendency to form a junction can be offset by heavy doping of the contact area.

The only metal which has been commonly used alone for ohmic contacts and interconnections is silicon planar transistors and integrated circuits is aluminum. Aluminum thin films of excellent quality are easily applied to semiconductor devices by evaporation, and patterned by photoresist techniques. Aluminum has adequate conductivity and its adherence to silicon and silicon oxide is excellent. Nevertheless, aluminum has significant disadvantages including particularly its tendency to form intermetallic compounds with gold at a very low temperature. There is also evidence that aluminum films tend to penetrate silicon oxide, probably due to a chemical interaction therewith.

Efforts have been made to develop an alloy of metals which will satisfy all the known requirements for forming reliable ohmic contacts with silicon, but the possibility of finding a suitable alloy is made difficult by the practical necessity that the contact metal be applied by evaporation. That is, the constituent metal selected must have vapor pressures very nearly equal, or else the alloy as such cannot be formed by evaporation. Even when the vapor pressures are very close the material applied by evaporation may comprise a mixture rather than an alloy. In any event, the metals of an alloy may exhibit a tendency to etch preferentially, which severely limits their utility.

An alternate approach to the problem has involved the use of plural metallization layers for ohmic contacts and electrical interconnections. For example, a first layer is selected to provide optimum contact with the semiconductor surface and optimum adherence to the oxide passivation, covered by a metal layer selected to provide optimum bonding characteristics for external lead wires. In practice, however, it has been found difficult to select a two-layer combination of metals satisfying all the known requirements, as outlined above, because of chemical interaction or poor adherence between the two metals. Consequently, various three-layer, sandwich-type metal contacts have been developed for specialized uses, wherein the intermediate layer is selected primarily for its ability to isolate the first and third metal layers from each other, while at the same time providing good adherence to both the first and third metal layers. However, no one combination of multilayered or sandwich-type contacts has been found to have widespread applicability for all devices.

It is an object of the present invention to provide a three-layer system of metal contacts for semiconductor devices and integrated circuits. More particularly, it is an object of the invention to provide semiconductor devices and integrated circuits with a thin-film metallization system characterized by a low-resistance, ohmic contact and good adherence to semiconductor surfaces, particularly silicon. Excellent chemical, electrical, thermal and mechanical properties are provided by the contacts applied to oxide-passivated planar structures.

It is a further object of the invention to provide a method for depositing successive layers of titanium, tungsten and gold on a semiconductor surface, for the purpose of providing improved ohmic contacts.

One aspect of the invention is embodied in an ohmic contact system for a semiconductor structure comprising a film of titanium in contact with the semiconductor surface, a film of tungsten covering said titanium film, and a film of gold covering the tungsten film. The titanium is selected as the first layer because of its excellent adherence both to semiconductor surfaces and to insulating passivation surfaces, including silicon dioxide and silicon nitride, and for the reliability with which it forms low-resistance ohmic contact to semiconductor surfaces, particularly to silicon. Tungsten is selected as the intermediate layer because of its ability to effectively isolate the titanium from the gold, and thereby avoid the formation of intermetallic compounds. The tungsten also provides excellent adherence to titanium and to the gold. Gold is selected as the final layer because of its excellent bonding characteristics and resistance to corrosion. All three metals are compatible with standard photolithographic techniques and are readily etchable using known aqueous etch solutions.

The invention is also embodied in a planar passivated semiconductor device comprising a semiconductor body having at least one PN junction therein, in combination with an insulating layer covered by successive films of titanium, tungsten and gold. Typically, such a device is made of monocrystalline silicon, passivated by means of a silicon dioxide layer having one or more openings therethrough at locations where ohmic contact with the silicon surface is desired.

A further aspect of the invention is embodied in an integrated semiconductor circuit comprising a passivated semiconductor body having a plurality of PN junctions therein, in combination with successive layers of titanium, tungsten and gold, interconnecting the surface of said semiconductor body at two or more locations exposed by openings in the passivation layer. The trimetal system of the invention is particularly suited for multilevel interconnecting metallization systems for integrated semiconductor circuits. That is, a first composite layer of titanuim-tungsten-gold is covered by an insulation layer having openings therein at selected locations, said insulation layer being covered by a second level of titanium-tungsten-gold which establishes ohmic contact with the first trimetal layer through said openings in the insulation layer.

The metallization system of the invention is particularly well suited for microwave devices wherein extremely fine geometries and close tolerances are required. In microwave devices, because of such fine geometries, it has been difficult heretofore to obtain ohmic contacts having reproducible resistance values. Ohmic contacts having a consistently reproducible resistance value are readily obtained with the present invention, particularly when the titanium layer is deposited by vacuum evaporation techniques instead of sputtering methods.

The trimetal contact system of the invention is also well suited for the fabrication of Schottky barrier diodes and for semiconductor devices made of various semiconductor materials other than silicon, including particularly germanium and III–V compound semiconductors such as gallium arsenide, gallium phosphide, and indium arsenide.

Figure 1:
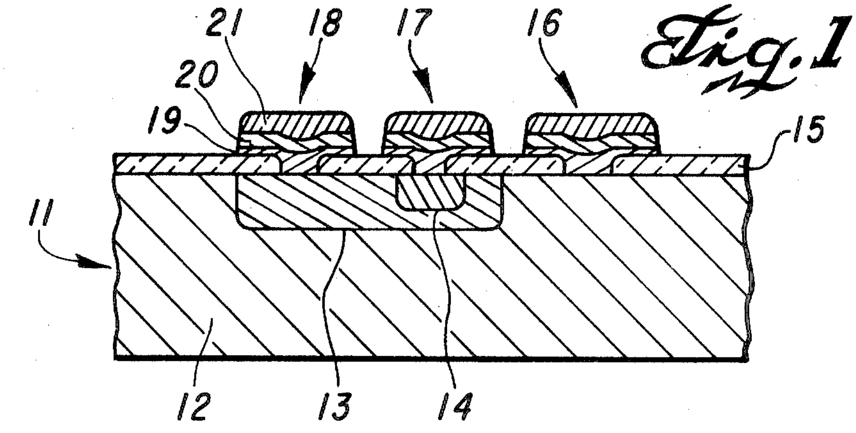
FIG. 1 is a fragmentary cross-sectional view of an integrated circuit structure.

In FIG. 1, semiconductor circuit 11 includes silicon body 12 having collector junction 13 and emitter junction 14 formed therein by known diffusion techniques. A passivating layer 15 of silicon dioxide extends across the silicon surface except where ohmic contact thereto is made, for example, by means of collector, emitter and base contacts 16, 17 and 18 respectively. Each of the contacts comprises successive layers 19, 20 and 21 of titanium, tungsten and gold, respectively.

Titanium film 19 is deposited by vacuum evaporation at a pressure below $10^{16}$ millimeters of mercury. For example, a pressure of about $5\times10^{17}$ millimeters of mercury is preferred. This is a lower pressure than typically used for evaporation processes and is preferable in the case of titanium because the titanium acts as a getter, and would more readily become contaminated in the event more moderate levels of vacuum were used. The titanium is typically wrapped in a tungsten filament and heated to a temperature sufficient to melt and evaporate the titanium. A titanium film thickness of 3 to 10 microinches is normally suitable, a thickness of about 5 microinches being preferred. A more uniform deposition is achieved in one embodiment by mounting the semiconductor substrate on a rotating platform.

When the titanium evaporation is finished, the slices are removed from the evaporator and placed immediately in a suitable sputtering system, for example, an R–F sputtering system, wherein tungsten film 20 is deposited to a thickness of about 8 to 12 microinches, preferably about 10 microinches using known techniques.

Gold film 21 is then sputtered on the tungsten film to a thickness of 10 to 30 microinches, preferably about 20 microinches.

Suitable etchant solutions are known for selectively patterning titanium, tungsten and gold. For example, titanium is etched at room temperature in an aqueous solution of hydrofluoric and nitric acids. Each acid is preferably present in a concentration of 2 to 3 percent.

Tungsten is etched using an aqueous solution of potassium ferricyanide and sodium oxalate in concentrations of 5 percent and 1 percent, respectively. This etch is preferably used at a temperature of about 55° C.

The gold is etched with a buffered solution of potassium cyanide at a temperature of about 80° C.

Each of the metals is readily masked against the respective etch solutions by means of known photoresist films, including particularly KMER marketed by Eastman-Kodak Company and Shipley's A–Z resist. The resist films are applied and patterned in accordance with well-known techniques.

Figure 2:
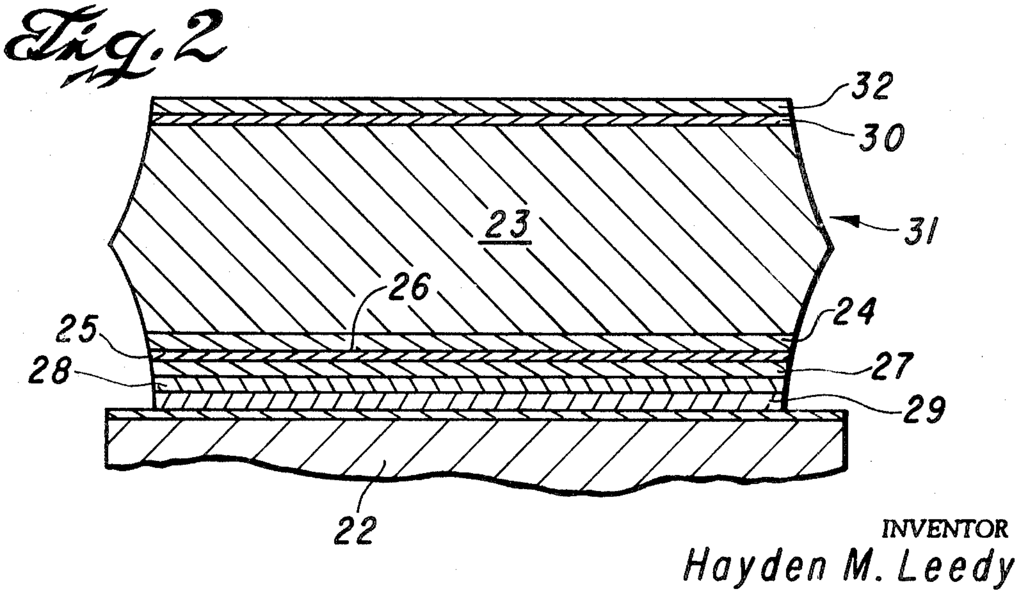
FIG. 2 is a cross-sectional view of an avalanche diode mounted on a gold-plated copper stud.

In FIG. 2, an avalanche diode 31 is shown mounted upon a gold-plated copper stud 22. The semiconductor structure consists of a silicon body 23 having a low resistivity, N type conductivity, and a thickness of about 2 mils. Region 24 is of N type conductivity having a substantially higher resistivity than region 23, and a thickness of about 5 microns. Region 25 forming PN junction 26 is of P type conductivity and low resistivity, having a thickness of about 2 microns.

Metallization layers 27, 28 and 29 comprising titanium, tungsten and gold, respectively, are provided adjacent P type layer 25. The structure is mounted on stud 22 by means of a gold-to-gold bond which may be formed readily by known techniques, including thermocompression bonding or ultrasonic welding. The successive layers of titanium, tungsten and gold are deposited in accordance with the procedures outlined above for the embodiment of FIG. 1.

Ohmic contact to the opposite side of the device consists of layers 30 and 32 of titanium and gold, respectively. The intermediate film of tungsten is unnecessary in this instance because any metallurgical interaction adjacent the N side of the wafer is of less importance because of its relatively greater distance from the PN junction.

What We claim is:

1. An ohmic contact system for a semiconductor comprising:

a. a film of titanium in contact with a semiconductor surface;

b. a film of tungsten covering and in direct contact with said titanium film; and c. a film of gold covering and in direct contact with said tungsten film.

2. A system as defined by claim 1 wherein said semiconductor is silicon.

3. A semiconductor device comprising a semiconductor body having at least one PN junction therein;

an insulating layer covering a surface of said body, said layer having an opening therethrough;

a film of titanium in contact with said semiconductor at the location exposed by said opening;

a film of tungsten covering in direct contact with said titanium film; and a film of gold covering in direct contact with said tungsten film.

4. A device as defined by claim 3 wherein the semiconductor is silicon.

5. An integrated semiconductor circuit comprising:

a semiconductor body having a plurality of PN junctions therein;

an insulating layer covering a surface of said body, said layer having a plurality of openings therein;

a film of titanium interconnecting said semiconductor surface at two locations exposed by said openings;

a film of tungsten covering in direct contact with said titanium film; and a film of gold covering in direct contact with said tungsten film.

6. A circuit as defined by claim 5 wherein said semiconductor is silicon.